United States Patent
Kim et al.

(10) Patent No.: US 6,684,652 B2
(45) Date of Patent: Feb. 3, 2004

(54) METHOD OF AND AN APPARATUS FOR REGULATING THE TEMPERATURE OF AN ELECTROSTATIC CHUCK

(75) Inventors: Jin-Man Kim, Seoul (KR); Yun-Sik Yang, Gyeonggi-do (KR); Sang-Jun Chun, Gyeonggi-do (KR); Young-Min Min, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/134,729

(22) Filed: Apr. 30, 2002

(65) Prior Publication Data

US 2002/0174667 A1 Nov. 28, 2002

(30) Foreign Application Priority Data

May 8, 2001 (KR) ........................................ 2001-24833

(51) Int. Cl.[7] .............................. F25D 17/02; F25B 1/00
(52) U.S. Cl. .......................... 62/185; 62/201; 62/259.2; 361/699; 156/345.27
(58) Field of Search ...................... 62/185, 201, 259.2, 62/430; 361/234, 688, 689, 699, 701; 156/345.27; 279/128

(56) References Cited

U.S. PATENT DOCUMENTS

| | | | | |
|---|---|---|---|---|
| 5,376,213 A | * | 12/1994 | Ueda et al. ................. 156/345 |
| 5,761,023 A | * | 6/1998 | Lue et al. ................... 361/234 |
| 5,835,334 A | * | 11/1998 | McMillin et al. ........... 361/234 |
| 6,086,952 A | * | 7/2000 | Lang et al. ............. 427/255.29 |
| 6,182,602 B1 | * | 2/2001 | Redeker et al. ......... 118/723 R |
| 6,189,483 B1 | * | 2/2001 | Ishikawa et al. ......... 118/723 E |
| 6,286,451 B1 | * | 9/2001 | Ishikawa et al. .......... 118/723 I |
| 6,320,737 B1 | * | 11/2001 | Hirano et al. ............... 361/234 |
| 2002/0000198 A1 | * | 1/2002 | Ishikawa et al. ............ 118/715 |

* cited by examiner

*Primary Examiner*—Marc Norman
(74) *Attorney, Agent, or Firm*—Volentine Francos, PLLC

(57) ABSTRACT

A refrigeration system regulates the temperature of an electrostatic wafer chuck disposed in a process chamber. The refrigeration system includes a heat exchanger disposed in a heat exchange relationship with the electrostatic chuck, a refrigerator, a temperature sensor, and a temperature controller for controlling the refrigerator to cool the coolant withdrawn from the heat exchanger to a desired temperature in response to the temperature detected by the temperature sensor. The heat exchanger forms a coolant passageway inside the electrostatic chuck, and the refrigerator is disposed outside the process chamber. The temperature sensor is disposed within the body of the electrostatic chuck. The temperature of the electrostatic chuck can be regulated so as to be maintained nearly constant because the temperature used to control the cooling of the coolant is measured directly from the body of the electrostatic chuck.

5 Claims, 23 Drawing Sheets

TEMPERATURE °C

TIME

TEMPERATURE °C

TIME

TEMPERATURE °C

TIME

TEMPERATURE °C

TIME

TEMPERATURE °C

TIME

TEMPERATURE °C

TIME

TEMPERATURE °C

TIME

TEMPERATURE °C

TIME

FIG. 8

| CATEGORY | GALDEN | FC-3283 | DI WATER(100%) | DI & E/G (70:30) | DI & E/G (50:50) | UNIT |
|---|---|---|---|---|---|---|
| HEAT CONDUCTIVITY | 1.67 | 1.59 | 13.4 | 11.2 | 9.08 | $10^{-4}$ cal/cm K |
| SPECIFIFC HEAT | 0.23 | 0.255 | 1.0 | 0.89 | 0.78 | cal/g K |
| DENSITY | 1.73 | 1.817 | 1.0 | 1.35 | 1.07 | g/cm$^3$ |

# METHOD OF AND AN APPARATUS FOR REGULATING THE TEMPERATURE OF AN ELECTROSTATIC CHUCK

BACKGROUND OF THE INVENTION

1. Field of the Invention

The present invention relates to a method of and an apparatus for cooling an electrostatic chuck of a semiconductor fabricating device. More particularly, the present invention relates to a method of and an apparatus for stabilizing the temperature of the electrostatic chuck.

2. Description of the Related Art

A semiconductor device comprises a great number of electric circuits. These circuits are formed on a wafer using a method known as photolithography. The photolithography method includes forming a conductive layer and an insulation layer on the wafer by vapor deposition, and then etching the conductive layer to pattern the conductive material and thereby form circuits.

The vapor deposition process and the etching process are performed in respective process chambers. An electrostatic chuck firmly fixes the wafer in the process chamber during the deposition or etching process. Recently, plasma deposition and etching apparatuses have widely used plasma for forming layers on a wafer and etching the layers, respectively.

In a typical plasma processing apparatus, the electrostatic chuck (hereinafter referred as ESC) is used as an electrode to form plasma from gas introduced into the chamber. Accordingly, when the plasma process is carried out, the temperature of the ESC temperature increases due to the hot plasma formed in the chamber. The temperature characteristics of the wafer supported by the electrostatic chuck are directly influenced by the temperature change of the ESC. Fluctuations in the thermal environment not only may cause the critical dimension (CD) of a wafer to vary from the desired CD, but also may cause the critical dimension to vary among the wafers that are sequentially processed in the apparatus.

The ESC is, therefore, usually cooled by a refrigeration unit mounted on the outside of the process chamber so as to minimize the thermal effect of the plasma on the wafer.

The conventional refrigeration unit circulates coolant from outside the process chamber to a heat exchanger disposed on the ESC inside the chamber. Accordingly, the ESC is cooled by a heat exchange process effected between the ESC and the coolant. The refrigeration unit withdraws the coolant from the ESC, cools the coolant and then again supplies the coolant (now cooled) to the ESC.

Refrigeration unit temperature sensors are installed on the outlet and on the inlet of the refrigeration unit, respectively, outside the process chamber. An outer temperature sensor is installed on a coolant-supplying pipe just outside the process chamber. The refrigeration system controls the temperature of the coolant in response to the temperatures detected by the refrigeration unit temperature sensors and the outer temperature sensor.

However, the conventional refrigeration system has a problem in that it can not accurately control the temperature of the coolant because it possesses an inherent delay in response time to changes in temperature of the ESC. This inherent delay in response time occurs because the coolant in the chamber takes time to reach the outer temperature sensor installed at the coolant-supplying pipe. Furthermore, significant time elapses before the coolant is re-supplied to the chamber, i.e., after it has been cooled in response to the detected temperatures. Therefore, the conventional refrigeration system makes it impossible to control the temperature of the electrostatic chuck in real time based on the temperature of the coolant.

Also, the coolant is supplied to the electrostatic chuck inside the chamber at a temperature independent of an intervening change in temperature of the electrostatic chuck. That is, again, the conventional refrigeration system does not offer a suitable response to actual changes in temperature of the electrostatic chuck. In addition, the conventional refrigeration system cannot prevent the ESC temperature from fluctuating widely due to a temperature difference between the ESC and the temperature to which a refrigerator of the system is set.

SUMMARY OF THE INVENTION

Therefore, an object of the present invention is to overcome the problems presented by the prior art.

Accordingly, a first object of the present invention is to provide a method of and an apparatus for regulating the temperature of an electrostatic chuck, wherein there occurs only a small difference between the temperature setting of the refrigerator and the ESC temperature, and wherein the time it takes to control the temperature of the coolant upon changes in temperature of the ESC is minimal, whereby the ESC temperature can be kept nearly constant.

A second object of the present invention is to provide a method of and an apparatus for regulating the temperature of an electrostatic chuck, characterized by high cooling efficiency and low cost (cost savings in connection with the coolant).

In a semiconductor fabricating apparatus according to the present invention, a refrigeration system for regulating the temperature of an electrostatic chuck comprises a heat exchanger for effecting a heat exchange between the electrostatic chuck and a coolant, a refrigerator disposed outside the process chamber for cooling down the coolant withdrawn from the heat exchanger and re-supplying the coolant to the heat exchanger, a temperature sensor disposed in the body of the electrostatic chuck itself for detecting an ESC temperature, and a temperature controller for controlling the refrigerator to cool the high temperature coolant withdrawn from the heat exchanger to a desired temperature in response to a temperature signal issued by the temperature sensor.

A coolant supplying pipe connects an inlet of the heat exchanger and an outlet of the refrigerator. A coolant withdrawal pipe connects an outlet of the heat exchanger and an inlet of the refrigerator. Thus, the heat exchanger, refrigerator and coolant pipes constitute a coolant loop through which the coolant circulates.

A deionizing filter may be provided in the coolant loop for deionizing the coolant withdrawn from the heat exchanger. In this case, the deionizing filter is disposed in-line with the coolant withdrawal pipe near the inlet of the refrigerator.

According to the present invention, the coolant is preferably a mixture of deionized water and an anti-freeze. And, the anti-freeze is preferably ethylene glycol. In this case, the ratio of the deionized water to the anti-freeze is 5:5.

In the method of regulating the temperature of the electrostatic chuck according to the present invention, the ESC temperature is measured directly from the body of the electrostatic chuck (by the temperature sensor installed in the body of the electrostatic chuck), coolant is supplied into the electrostatic chuck (via a coolant passageway of the heat exchanger) to chill the electrostatic chuck, and the coolant is chilled (by the refrigerator disposed outside the plasma chamber) in response to the detected ESC temperature.

BRIEF DESCRIPTION OF THE DRAWINGS

The above and other objects, features and advantages of the present invention will become more readily apparent from the following detailed description of the preferred embodiments thereof made with reference to the accompanying drawings, of which:

FIG. 8 is a table of physical properties of various coolants;

DETAILED DESCRIPTION OF THE PREFERRED EMBODIMENTS

Hereinafter, the preferred embodiments of the present invention will be described in detail with reference to the accompanying drawings.

Figure 1:
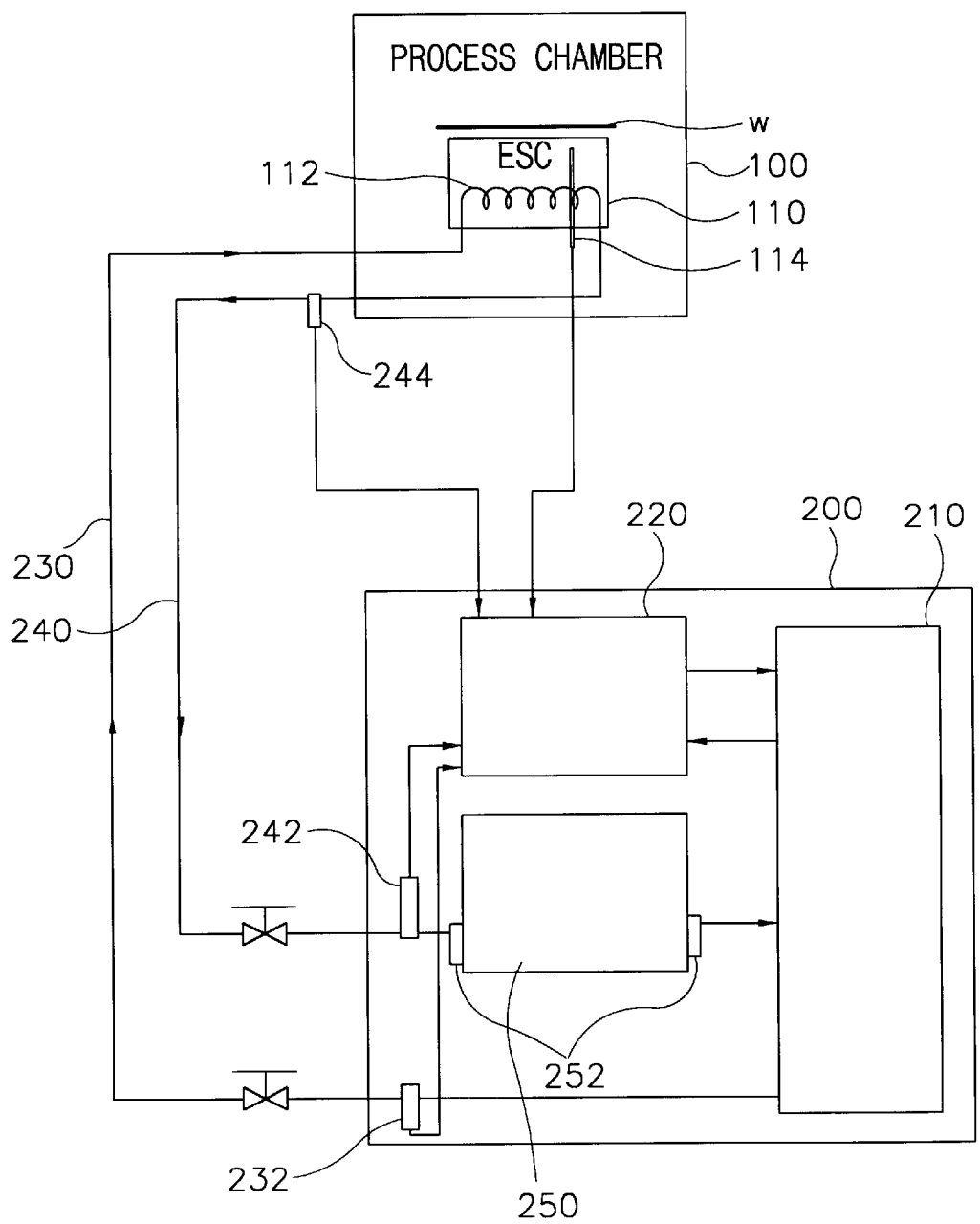
FIG. 1 is a schematic diagram of a refrigerating system of an electrostatic chuck according to the present invention.

Referring to FIG. 1, a high frequency plasma processing apparatus includes a process chamber 100 to which a gas source and a high frequency power source are connected for generating a plasma in the chamber, an electrostatic chuck 110 disposed in the process chamber 100 for holding a wafer "w" during plasma processing of the wafer, and a refrigeration system for regulating the temperature of the electrostatic chuck 110 according to the present invention. The refrigeration system includes a heat exchanger 112 and a temperature sensor 114 integrated with the electrostatic chuck 110 inside a process chamber 100, and a refrigeration unit 200 disposed outside the chamber 100.

The heat exchanger 112 has an inlet and an outlet, and a coolant passageway formed therebetween in the electrostatic chuck 110. Accordingly, the coolant is supplied into the body of the electrostatic chuck 110 via the inlet of the heat exchanger 112, and then flows within the body of the electrostatic chuck along the coolant passageway of the heat exchanger 112. Finally, the coolant is discharged out of the electrostatic chuck 110 through the outlet of the heat exchanger 112. As a result, heat is exchanged between the coolant and the body of the electrostatic chuck 110.

The refrigeration unit 200 is connected with the heat exchanger 112 in the process chamber 100 through a coolant supplying pipe 230 and a coolant withdrawal pipe 240.

The refrigeration unit 200 includes a refrigerator 210, and a temperature controller 220. The refrigerator 210, a typical mechanical refrigerating device, cools the coolant to a desired temperature under the control of the temperature controller 220, supplies the coolant to the heat exchanger 112 through the coolant supplying pipe 230, and withdraws the coolant 240 from the heat exchanger 112 through the coolant withdrawal pipe 240.

Even though the electrostatic chuck 110 is heated to a certain temperature by plasma, the coolant absorbs heat from the electrostatic chuck 110 through the above-described coolant loop, including the heat exchanger 112, to cool the ESC 110 and maintain the ESC 110 at a desired temperature. A supplying pipe temperature sensor 232 is installed on the coolant supplying pipe 230 in the vicinity of the outlet of the refrigerator 210, and a withdrawal pipe temperature sensor 242 is installed on the coolant withdrawal pipe 240 in the vicinity of the inlet of the refrigerator 210. Furthermore, an outer temperature sensor 244 is installed on the coolant withdrawal pipe 240 in the vicinity of the process chamber 100.

The temperature controller 220 is connected to an ESC temperature sensor 114 installed in the electrostatic chuck 110. The temperature controller 220 detects the ESC temperature by means of the ESC temperature sensor 114 and controls the refrigerator 210 to cool the coolant temperature down in response to the ESC temperature.

Galden (perfluorinated fluorocarbon fluid produced by Ausimont of Bollate, Italy), FC-3283 (fluorinated fluid produced by 3M, U.S.A) or deionized water may be used as the coolant. The deionized water is preferable, however, to the FC-3283.

When deionized water is used as the coolant, a deionizing filter 250 is disposed in-line with the coolant withdrawal pipe 240 in the vicinity of the inlet of the refrigerator 210. The deionizing filter 250 filters the coolant such that only a deionized component of the coolant is supplied to the refrigerator 210. Non-resistance sensors 252 are installed on an inlet and an outlet of the deionizing filter 250, respectively.

The manner in which the above-described refrigerating apparatus is operated to regulate the temperature of the electrostatic chuck is as follows.

First of all, however, results of experiments that have determined the causes of temperature instability when the refrigeration unit 200 is used will be described.

Figure 2:
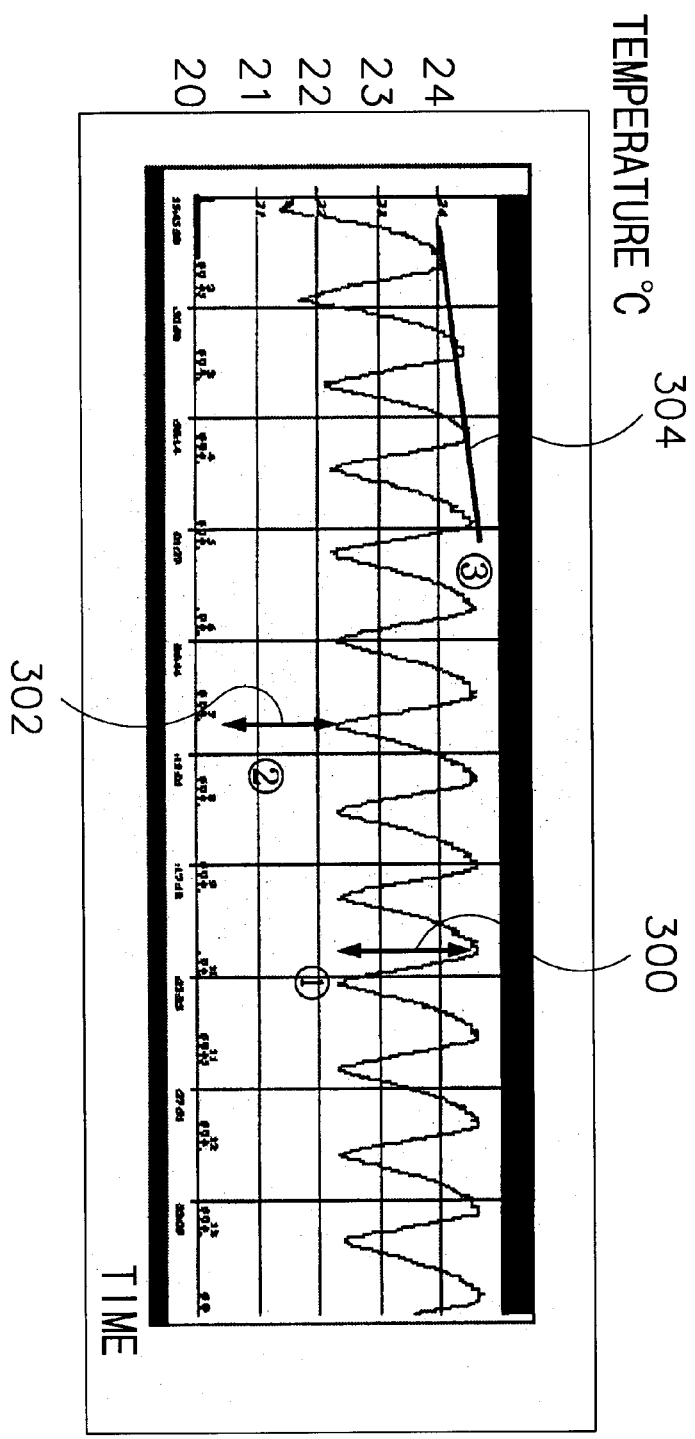
FIG. 2 is a graph showing a temperature characteristic of an electrostatic chuck of a conventional RF plasma apparatus.

Referring to FIG. 2, when the refrigerator is set at a temperature of 20° C., the conventional electrostatic chuck experiences a temperature variation 300 in a range of 2° C. to 4° C. that can be attributed solely to inherent limitations in the system performing the cooling process. When the processing apparatus to which the refrigerating apparatus is applied is used to form a bit-line contact hole, the conventional electrostatic chuck operates at a temperature that is 2° C. to 5° C. higher (302) than the temperature (20° C.) to which the refrigerator is set. When the processing apparatus to which the refrigerating apparatus is applied is used to form a metal contact hole, the temperature of the conventional electrostatic chuck is 3° C. to 10° C. higher than the temperature to which the refrigerator is set. Furthermore, the conventional electrostatic chuck experiences a temperature variation 304 in a range of 0.5° C. to 2° C. solely as the result of turning on the RF power.

These three causes of the temperature deviation of the ESC will be described now in further detail.

1. Temperature variation W$\Delta$t in a respective wafer.

Heat Q1 supplied to the electrostatic chuck in the RF plasma process chamber can be calculated using the following formula:

$$Q1 = 0.24 \times P \times t$$

wherein P is RF power and t is time.

The heat Q2 transferred from the electrostatic chuck to the coolant can be calculated using the following formula:

$$Q2 = h \times \alpha \times \rho \times A \times v \times (T1 - T2) \times t$$

wherein h is a coefficient of thermal conductivity between the electrostatic chuck and the coolant, $\alpha$ is a coefficient based on the shape of the heat exchanger, $\rho$ is the density of the coolant, A is the cross-sectional area of the coolant passageway of the heat exchanger, v is the flow rate of the coolant, T1 is the ESC temperature, T2 is the coolant temperature, and t is the total time that the coolant flows through the electrostatic chuck.

Accordingly, the temperature variation W$\Delta$t of an individual wafer resulting from a temperature increase in the electrostatic chuck during processing can be calculated using the following formula:

$$W\Delta t = \frac{Q1 - Q2}{C \times M}$$

wherein C is the specific heat of the aluminum body of the electrostatic chuck (0.211 Kcal/Kg ° C. at 20° C.) and M is the mass of the electrostatic chuck.

That is, the temperature variation of the wafer is dependent on the amount of heat exchanged between the electrostatic chuck and the coolant. Therefore, the electrostatic chuck and the coolant cannot be in a state of thermal equilibrium because whereas the mechanical properties of the system, namely the configuration of the heat exchanger and the unit flow rate of the coolant, are constant, the physical properties of the coolant, such as thermal conductivity, density, specific heat etc. vary. The wafer is thus believed to necessarily experience some temperature variations for these reasons.

2. Difference in temperature E$\Delta$t between the electrostatic chuck and the coolant.

As discussed above, a state of thermal equilibrium cannot be established between the electrostatic chuck and the coolant. The difference E$\Delta$t between the ESC temperature and the temperature to which the coolant has been cooled affect a temperature slope characteristic of the electrostatic chuck when the RF power is turned on/off. Specifically, the temperature difference E$\Delta$t is inversely proportional to the time the RF power is turned off.

Furthermore, the coolant is supplied and withdrawn between the electrostatic chuck 100 and the refrigerator 210 via the coolant supplying pipe 230 and the coolant withdrawal pipe 240. Accordingly, a component of the temperature difference E$\Delta$t can be attributed to heat loss occurring along the coolant supplying pipe 230 and the coolant withdrawal pipe 240.

Figure 3:
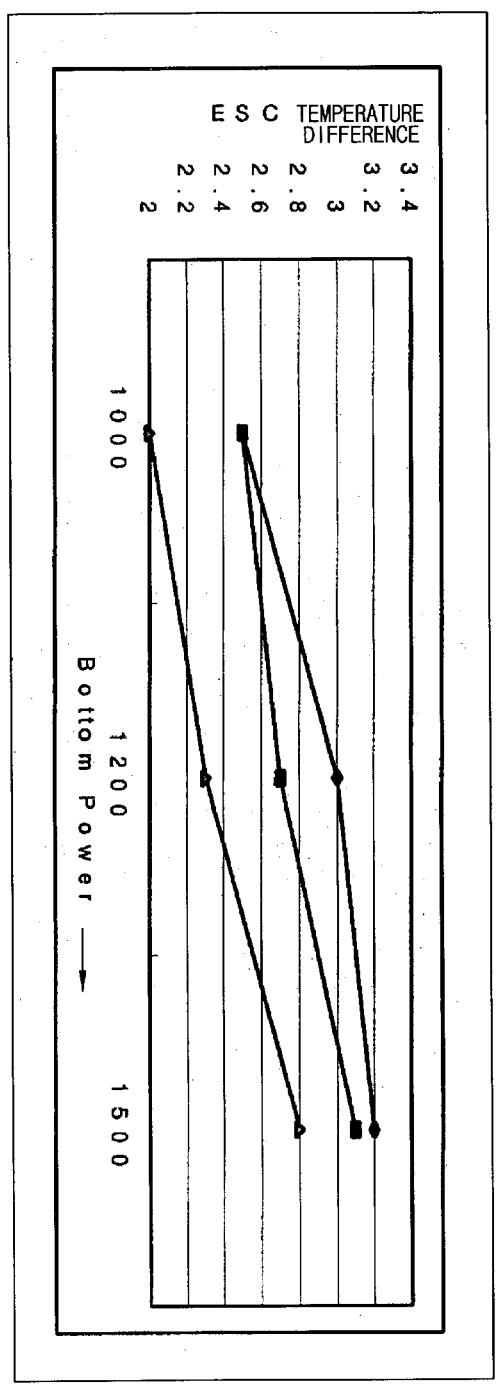
FIG. 3 is a graph showing the temperature variation between the temperature to which the refrigerator is set and the ESC temperature, according to RF power.

Referring to FIG. 3, the temperature difference is dependent on the temperature to which the refrigerator is set and the RF power. Specifically, the lower the setting of the refrigerator is, the greater the temperature difference becomes. And, the stronger the RF power is, the greater the temperature difference becomes.

3. Temperature difference L$\Delta$t between wafers in the same lot.

Heat accumulates in the electrostatic chuck as the RF power is turned on and off because the RF power is on for a much longer time than it is off as each wafer in a lot is being processed. With this in mind, the temperature difference L$\Delta$t between the wafers in the same lot can be expressed as follows:

$$L\Delta t = \frac{\sum W(QT1 - QT2)}{C \times M}$$

wherein W is the number of wafers in the lot, QT1 is the amount of heat supplied to the electrostatic chuck during the time the RF power is on, QT2 is the amount of heat that dissipates from the electrostatic chuck during the time the RF power is off, C is the specific heat of aluminum (0.211 Kcal/Kg ° C. at 20° C.), and M is the mass of the electrostatic chuck.

FIGS. 4A to 4D illustrate the dependence of a temperature characteristic of the electrostatic chuck on the type of coolant and position of a temperature sensor in an RF plasma apparatus performing a metal contact hole forming process.

Figure 4A:
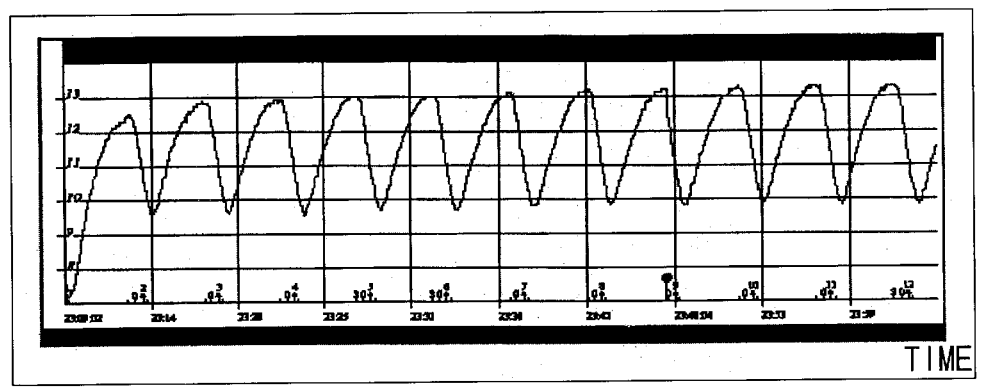
FIGS. 4A to 4D are graphs showing the dependence of a temperature characteristic of the electrostatic chuck on the type of coolant and position of a temperature sensor in an RF plasma apparatus used to carry out a metal contact hole forming process.

FIG. 4A shows the temperature characteristic of the electrostatic chuck when FC-3283 is used as the coolant. Referring to FIG. 4A, the mean temperature is 11.5° C., the temperature difference between the wafers is 1° C. and a process temperature variation (temperature variation in a wafer) is 3.5° C.

Figure 4B:
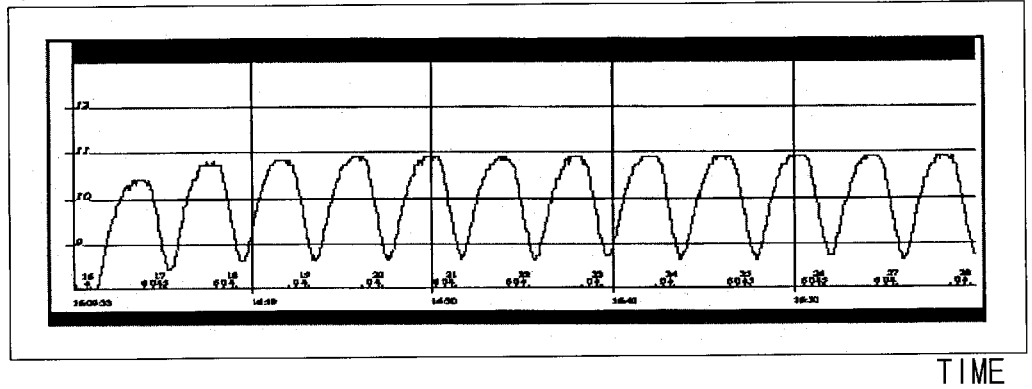

FIG. 4B shows the temperature characteristic of the electrostatic chuck when an outer temperature sensor is attached to the coolant withdrawal pipe and FC-3283 is used as the coolant. Referring to FIG. 48, the mean temperature is 9.8° C., the temperature difference between the wafers is 0.6° C. and the process temperature variation (temperature variation in a wafer) is 2.2° C.

Figure 4C:
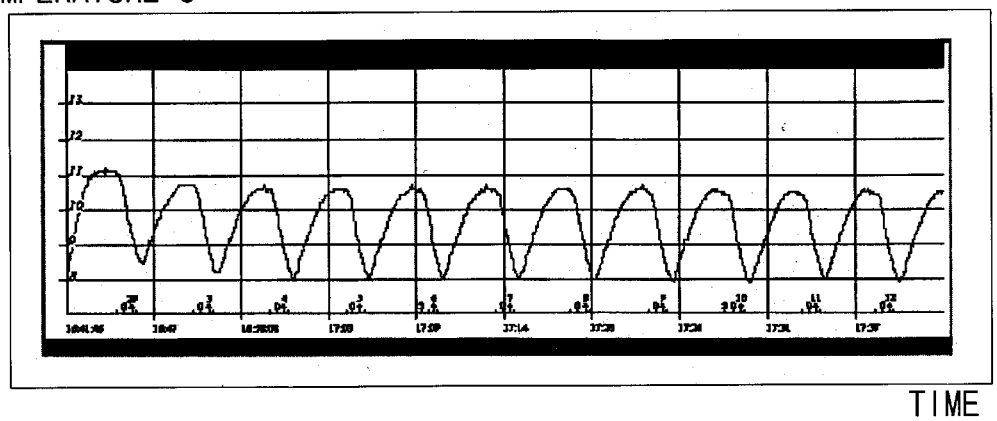

FIG. 4C shows the temperature characteristic of the electrostatic chuck when a withdrawal pipe temperature sensor is adopted and a mixture of deionized water and ethylene glycol is used as the coolant. Referring to FIG. 4C, the mean temperature is 9.3° C., the temperature difference between the wafers is 0.5° C., and the process temperature variation (temperature variation in a wafer) is 2.5° C.

Figure 4D:
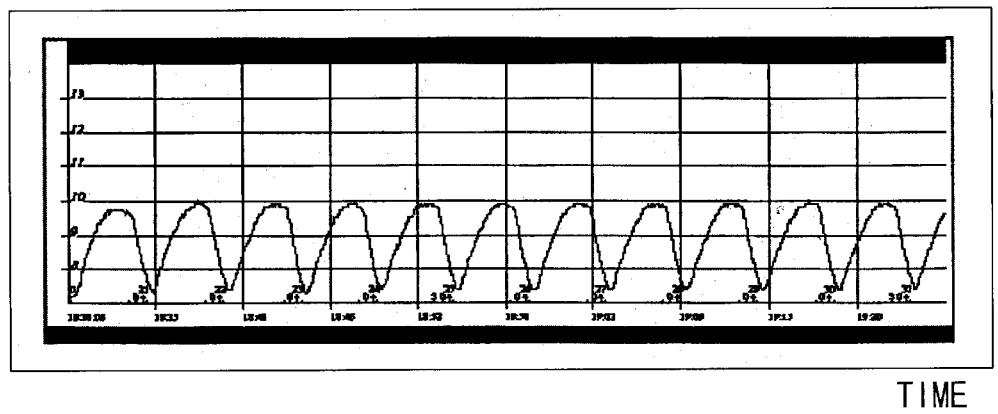

FIG. 4D shows the temperature characteristic of the electrostatic chuck under when an outer temperature sensor is attached to the coolant withdrawal pipe and a mixture of deionized water and ethylene glycol is used as the coolant. Referring to FIG. 4D, the mean temperature is 8.7° C., the temperature difference between the wafers is 0.2° C., and the process temperature variation (temperature variation in a wafer) is 2.4° C.

FIGS. 5A to 5E illustrate the dependence of a temperature characteristic of the electrostatic chuck on the type of coolant and position of a temperature sensor in an RF plasma apparatus performing a bit-line contact hole forming process.

Figure 5A:
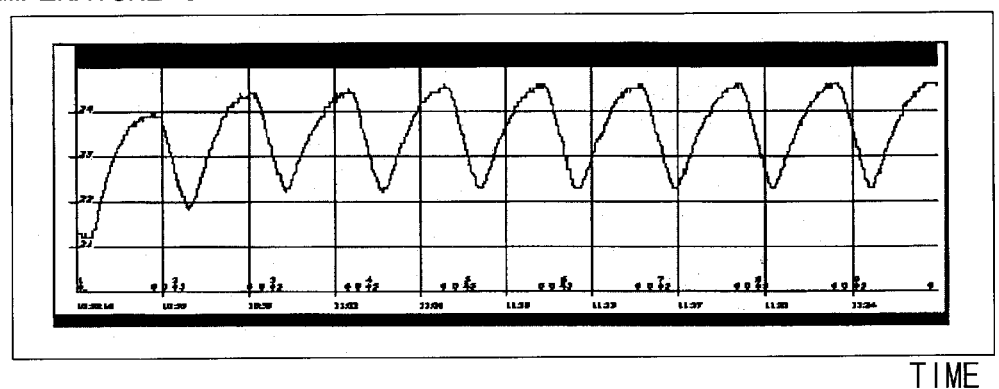
FIGS. 5A to 5E are graphs showing the dependence of a temperature characteristic of the electrostatic chuck on the type of coolant and position of a temperature sensor in an RF plasma apparatus used to carry out a bit-line contact hole forming process.

FIG. 5A shows the temperature characteristic of the electrostatic chuck when FC-3283 is used as the coolant. Referring to FIG. 5A, the mean temperature is 23.5° C., the temperature difference between the wafers is 0.7° C. and the process temperature variation (temperature variation in a wafer) is 2.5° C.

Figure 5B:
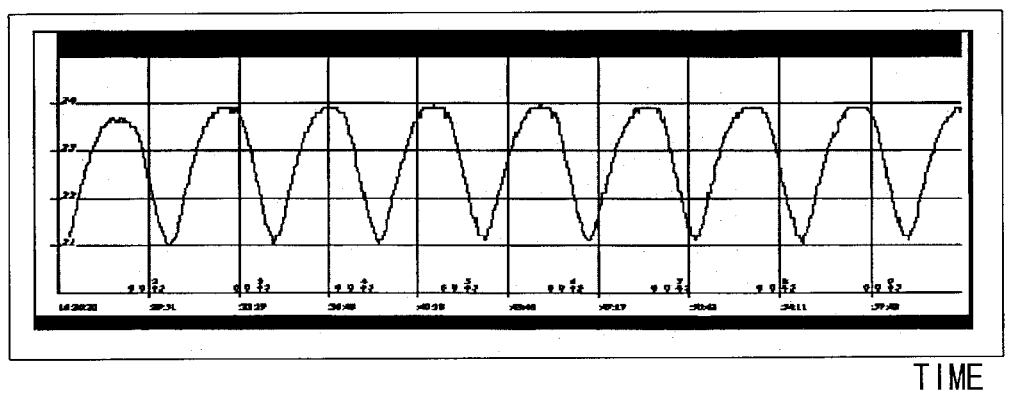

FIG. 5B shows the temperature characteristic of the electrostatic chuck when an outer temperature sensor is attached to the coolant withdrawal pipe and the FC-3283 is used as the coolant. Referring to FIG. 5B, the mean temperature is 22.5° C., the temperature difference between the wafers is 0.3° C. and the process temperature variation (temperature variation in a wafer) is 2.7° C.

Figure 5C:
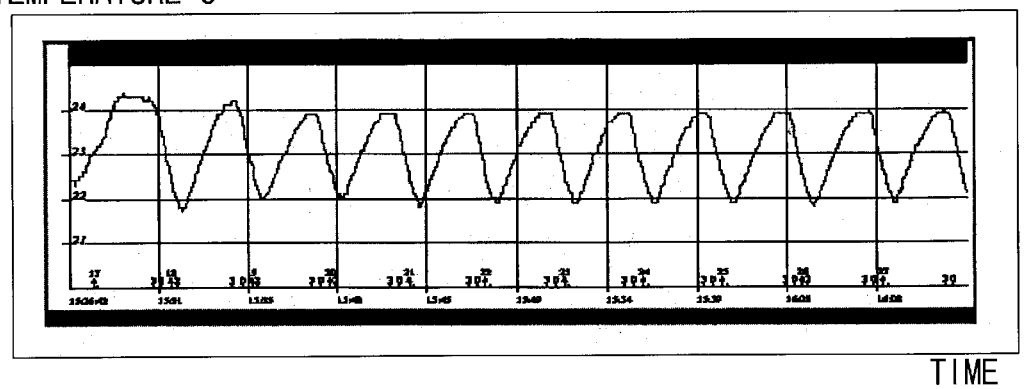

FIG. 5C shows the temperature characteristic of the electrostatic chuck when a withdrawal pipe temperature sensor is adopted and a mixture of deionized water and ethylene glycol, in a ratio of about 5:5, is used as the coolant. Referring to FIG. 5C, the mean temperature is 23° C. and the process temperature variation (temperature variation in a wafer) is 2.0° C.

Figure 5D:
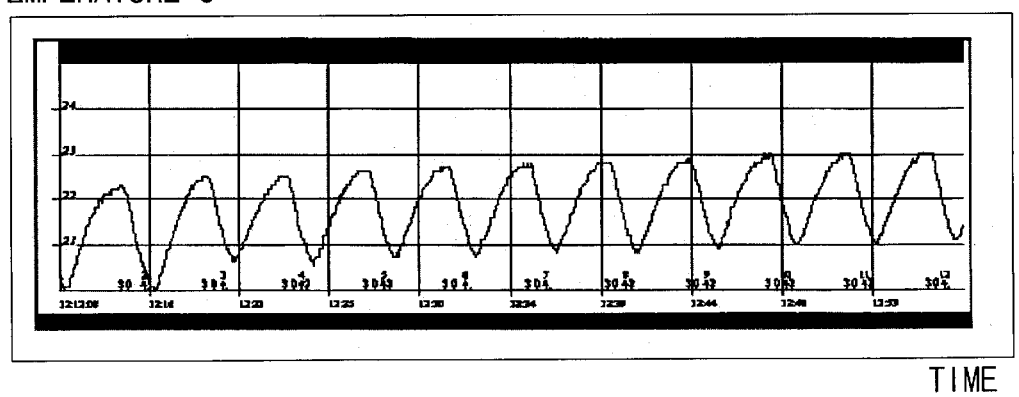

FIG. 5D shows the temperature characteristic of the electrostatic chuck when an outer temperature sensor is attached to the coolant withdrawal pipe and a mixture of deionized water and ethylene glycol, in a ratio of about 5:5, is used as the coolant. Referring to FIG. 5D, the mean temperature is 22° C. and the process temperature variation (temperature variation in a wafer) is 2° C.

Figure 5E:
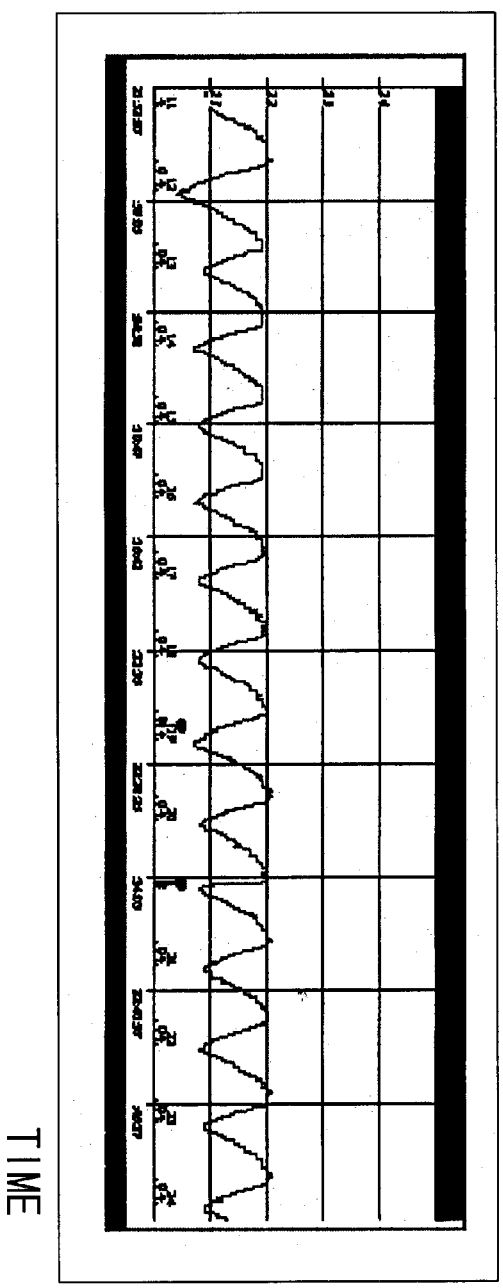

FIG. 5E shows the temperature characteristic of the electrostatic chuck under when an outer temperature sensor is attached to the coolant withdrawal pipe and pure deionized water is used as the coolant. Referring to FIG. 5E, the mean temperature is 21.4° C. and the process temperature variation (temperature variation in a wafer) is 1° C.

As can be discerned from above, although the temperature setting of the refrigerator is lower for the metal contact hole forming process than for the bit-line contact hole forming process, the temperature variation is higher in the metal contact hole forming process than that in the bit-line contact hole forming process. Furthermore, the greater the cooling capacity of the coolant is, the doser the mean temperature will become to the temperature setting, i.e., the smaller the temperature difference between the wafers becomes.

The process temperature variation is smaller when the outer temperature sensor is attached to the coolant withdrawal pipe rather than when a temperature sensor is adopted, and as the ESC temperature approaches the temperature setting, the process temperature variation decreases.

FIGS. 6A to 6D show the dependence of the temperature characteristic of the electrostatic chuck on the type of coolant and temperature setting, when a refrigerating system having a temperature sensor installed on an ESC is employed according to the present invention.

Figure 6A:
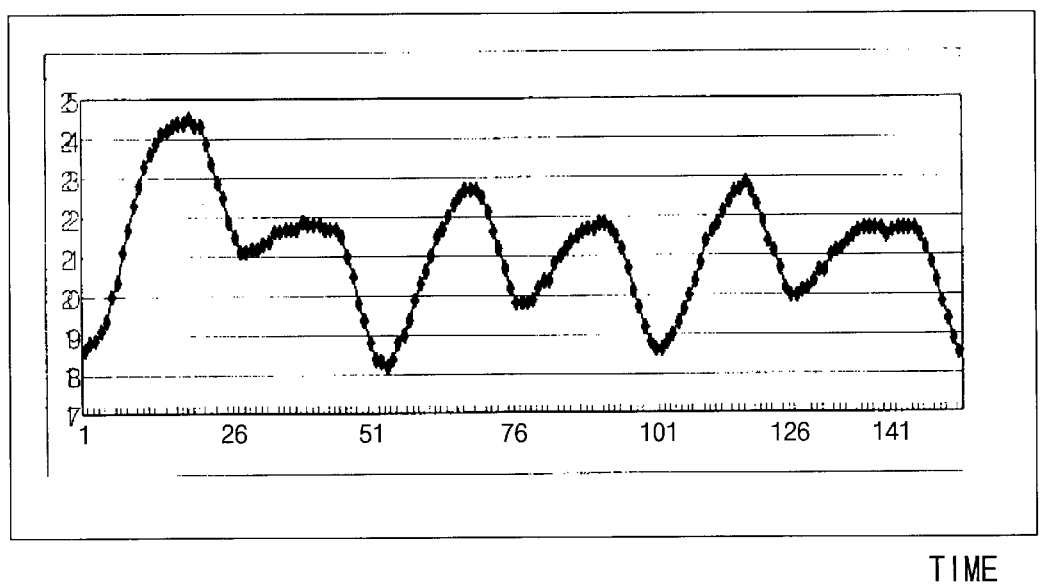
FIGS. 6A to 6D are graphs showing the dependence of a temperature characteristic of the electrostatic chuck on the type of coolant and temperature to which the refrigerator is set, according to the present invention.

FIG. 6A shows the temperature characteristic of the electrostatic chuck when FC-3283 is used as the coolant and the temperature setting is 20° C. Referring to FIG. 6A, the mean temperature is 20.8° C. and the process temperature variation (temperature variation in a wafer) is ±2.4° C. Therefore, FC-3283 is not a good choice for the coolant in this case because the temperature variation is very large. And, FC3283 cannot be used as a coolant at all in a low temperature process in which the temperature setting is about 5° C.

Figure 6B:
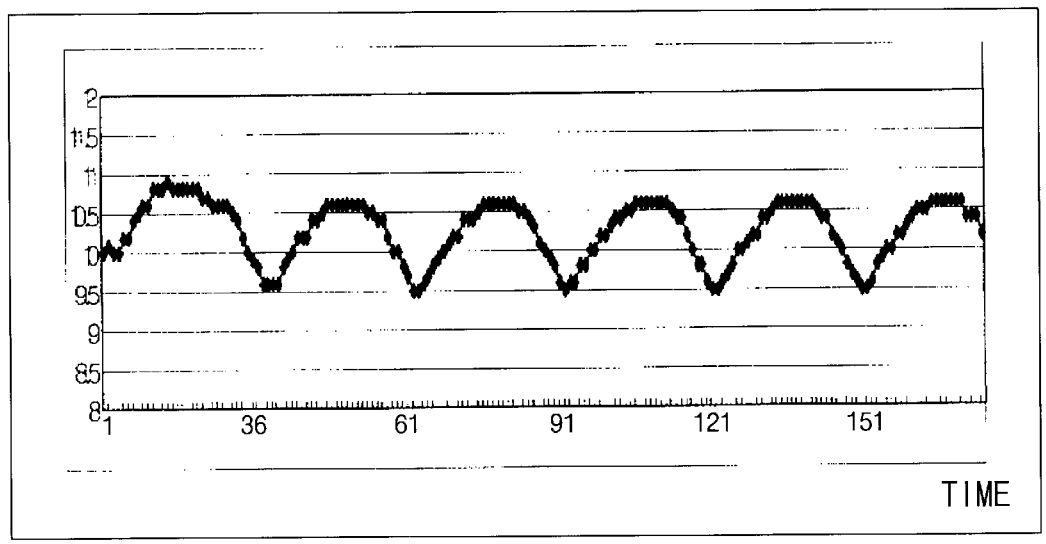

FIG. 6B shows the temperature characteristic of the electrostatic chuck under when pure deionized water is used as the coolant and the temperature setting is 10° C. Referring to FIG. 6B, the mean temperature is 10.1° C. and the process temperature variation (temperature variation in a wafer) is ±0.6° C. The mean temperature is nearly equal to the temperature setting, and the process temperature variation is nearly 1° C. Therefore, although pure deionized water may performs well as a coolant in this case, it posses limitations due to the fact that it will freeze in a low temperature process.

Figure 6C:
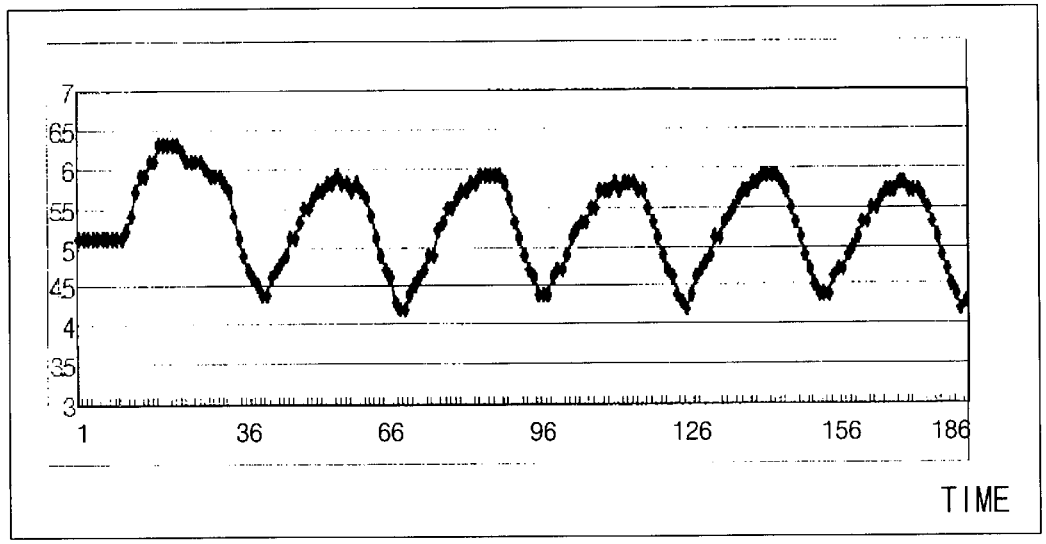

FIG. 6C shows the temperature characteristic of the electrostatic chuck under when a mixture of deionized water and ethylene glycol, in a ratio of 7 to 3, is used as the coolant and the temperature setting is 5° C. Referring to FIG. 6C, the mean temperature is 5.1° C. and the process temperature variation (temperature variation in a wafer) is ±0.8° C. Therefore, such a mixture of deionized water and ethylene glycol offers satisfactory performance as a coolant, and yet will not freeze when used in a low temperature process. Accordingly, a mixture of deionized water and ethylene glycol at a ratio of 7 to 3 is a good choice for the coolant in the low temperature process.

Figure 6D:
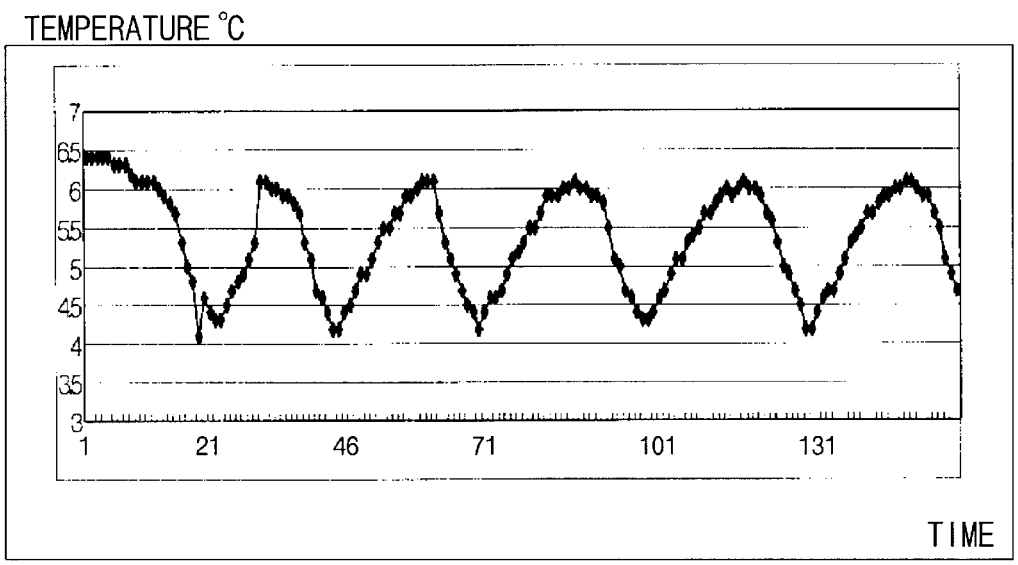

FIG. 6D shows the temperature characteristic of the electrostatic chuck when a mixture of deionized water and ethylene glycol, in a ratio of about 5:5, is used as the coolant and the temperature setting is 5° C. Referring to FIG. 6D, the mean temperature is 5.2° C. and the process temperature variation (temperature variation in a wafer) is ±1° C. Again, such a mixture of deionized water and ethylene glycol offers satisfactory performance as a coolant, and yet will not freeze when used in a low temperature process. Accordingly, a mixture of deionized water and ethylene glycol at a ratio of 5:5, is also a good choice for the coolant in the low temperature process.

In summary then, when the ESC temperature sensor is used according to the present invention, deionized water is a good choice for the coolant because of its high cooling capacity. However, anti-freeze, such as ethylene glycol, must be added to the coolant in order to prevent the coolant from freezing in a low temperature process, namely a process wherein the prevailing temperature conditions in the system are no more than about 10° C.

Figure 7:
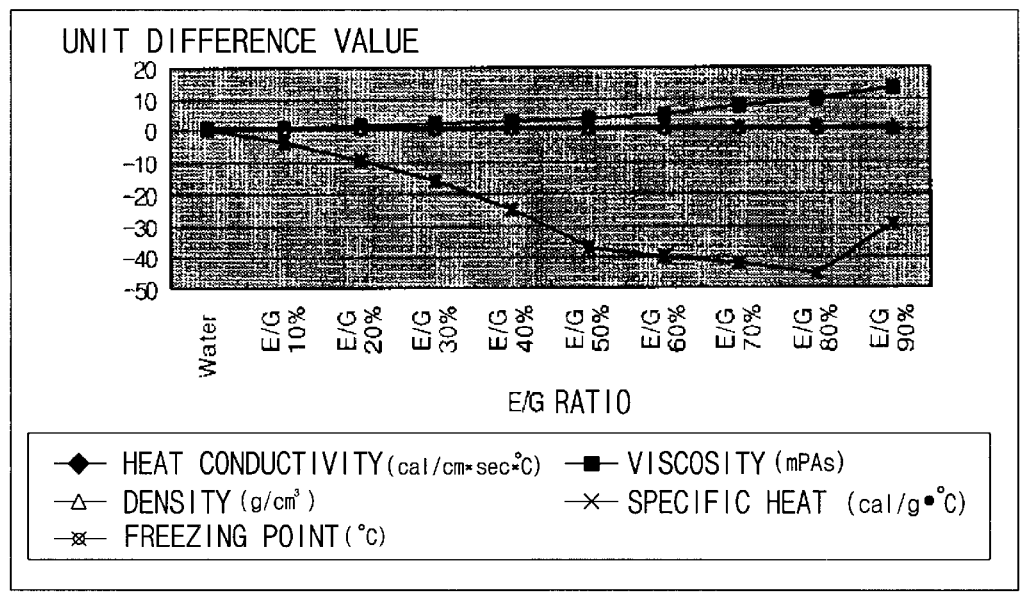
FIG. 7 is a graph showing physical properties of the coolant according to the ratio of deionized water to ethylene glycol.

FIG. 7 illustrates physical properties of a variety of different mixtures of deionized water and ethylene glycol. In FIG. 7, the ratio of the ethylene glycol to the pure deionized water of a particular mixture can be found along the horizontal axis, and unit difference values of various physical properties for each mixture can be found along the vertical axis. A unit difference value is the difference between a measured value of a physical property of a respective mixture from the value of the same physical property of pure deionized water. Therefore, a (−) sign in front of a unit difference value means that the mixture has a specific physical property lower than that of pure deionized water.

Referring to FIG. 7, as the proportion of the ethylene glycol increases in the coolant, the thermal conductivity, density and specific heat of the coolant remains constant but the viscosity of the coolant increases and the freezing point decreases. The freezing point of the coolant shows a characteristic rapid drop the proportion of the ethylene glycol is 50%. As the proportion of the ethylene glycol increases beyond 50%, the rate at which the freezing point drops decreases. Once the proportion of the ethylene glycol exceeds 80% in the mixture, the freezing point begins to increase.

Referring to FIG. 8, the cooling capacity of deionized water is about 2.1 times that of FC-3283 as suggested by the differences in the specific heat and density thereof. However, the difference in thermal conductivity suggests that the cooling capacity of deionized water may be said to be about 17 times that of FC-3283.

Nonetheless, as was discussed above, in a low temperature process, the deionized water should be mixed with ethylene glycol preferably in a ratio of about 5:5 in consideration of the freezing point of the coolant and the critical point of the ethylene glycol. The cooling capacity of such a mixture of deionized water and ethylene glycol (at a ratio of 5:5) is still about 10.3 times that of FC-3283.

Figure 9A:
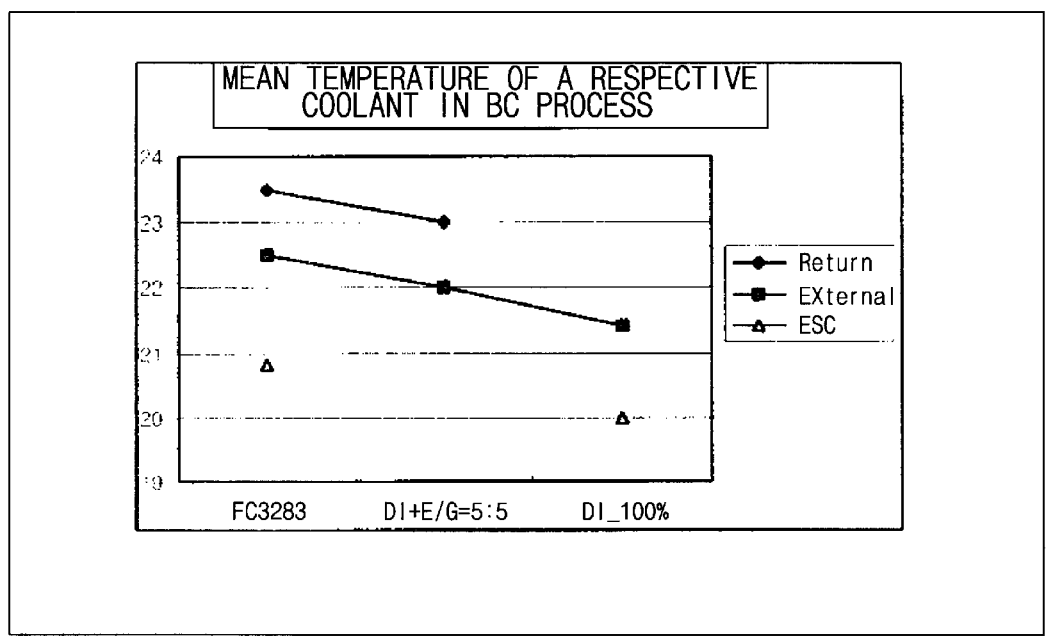
FIGS. 9A and 9B are graphs showing the dependence of a mean temperature characteristic of the electrostatic chuck on the type of coolant and position of a temperature sensor with respect to a bit-line contact hole forming process.
Figure 9B:
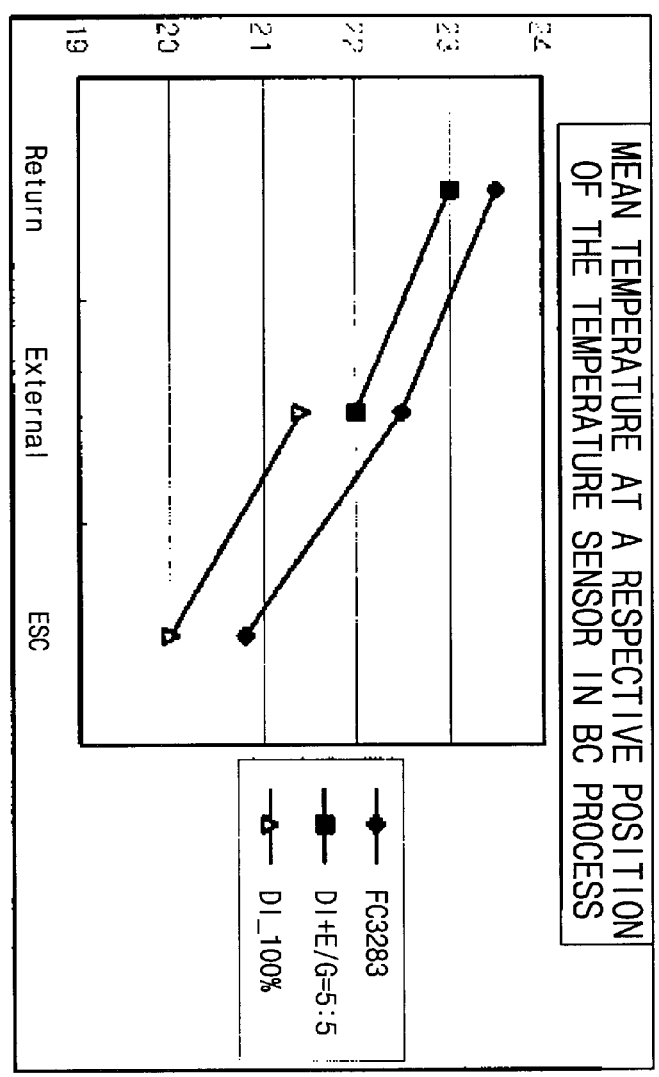
Figure 10A:
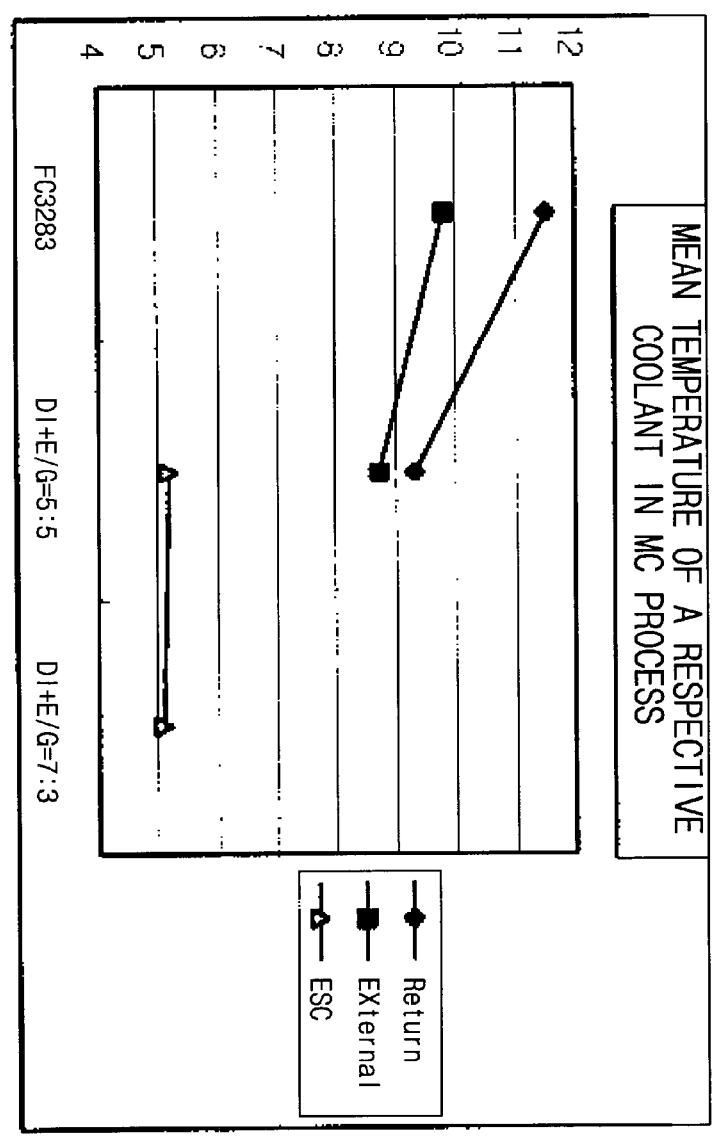
FIGS. 10A and 10B are graphs showing the dependence of a mean temperature characteristic of the electrostatic chuck on the type of coolant and position of a temperature sensor with respect to a metal contact hole forming process.
Figure 10B:
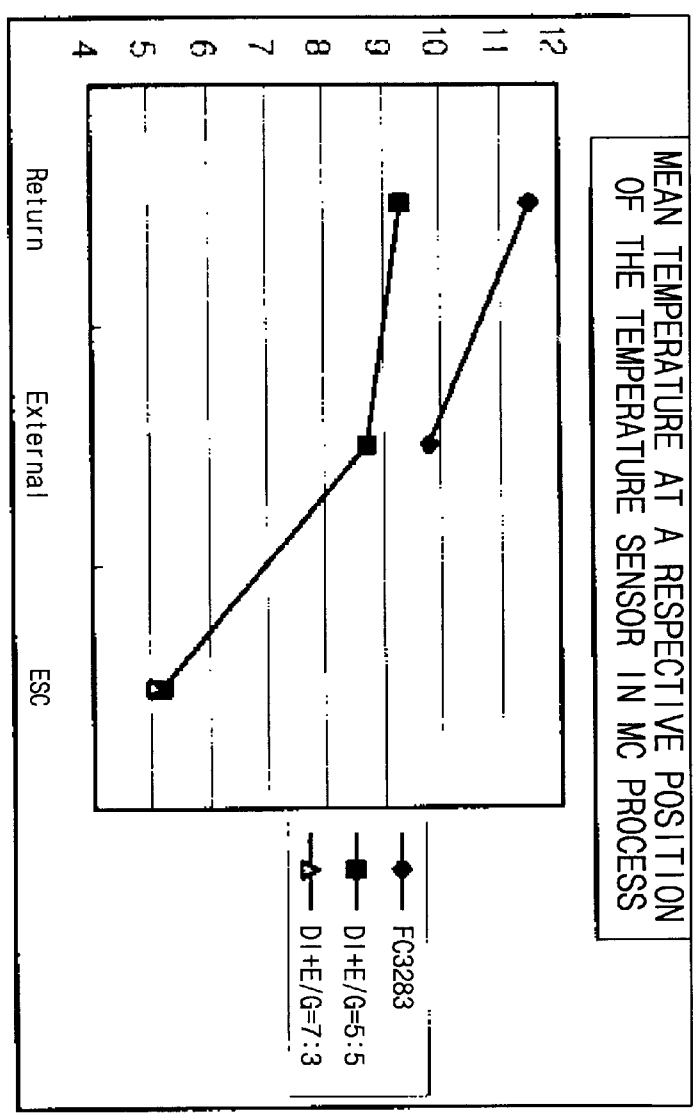

FIGS. 9A and 9B show the dependence of the mean temperature characteristic of the electrostatic chuck on the type of coolant and position of the temperature sensor in a bit-line contact hole forming process, and FIGS. 10A and 10B show the dependence of the mean temperature characteristic of the electrostatic chuck on the type of coolant and position of the temperature sensor in a metal contact hole forming process.

As shown in FIGS. 9A to 10B, the mean temperature is closer to the temperature setting when the ESC temperature sensor is installed in the electrostatic chuck and the deionized water is used as the coolant than when the withdrawal temperature sensor or outer temperature sensor is employed and FC-3283 is used as the coolant.

That is, the extent to which the ESC temperature will deviate from the temperature setting is influenced more by the position of the temperature sensor than by the type of coolant. This is because the coolant temperature is controlled with reference to the ESC temperature.

Figure 11A:
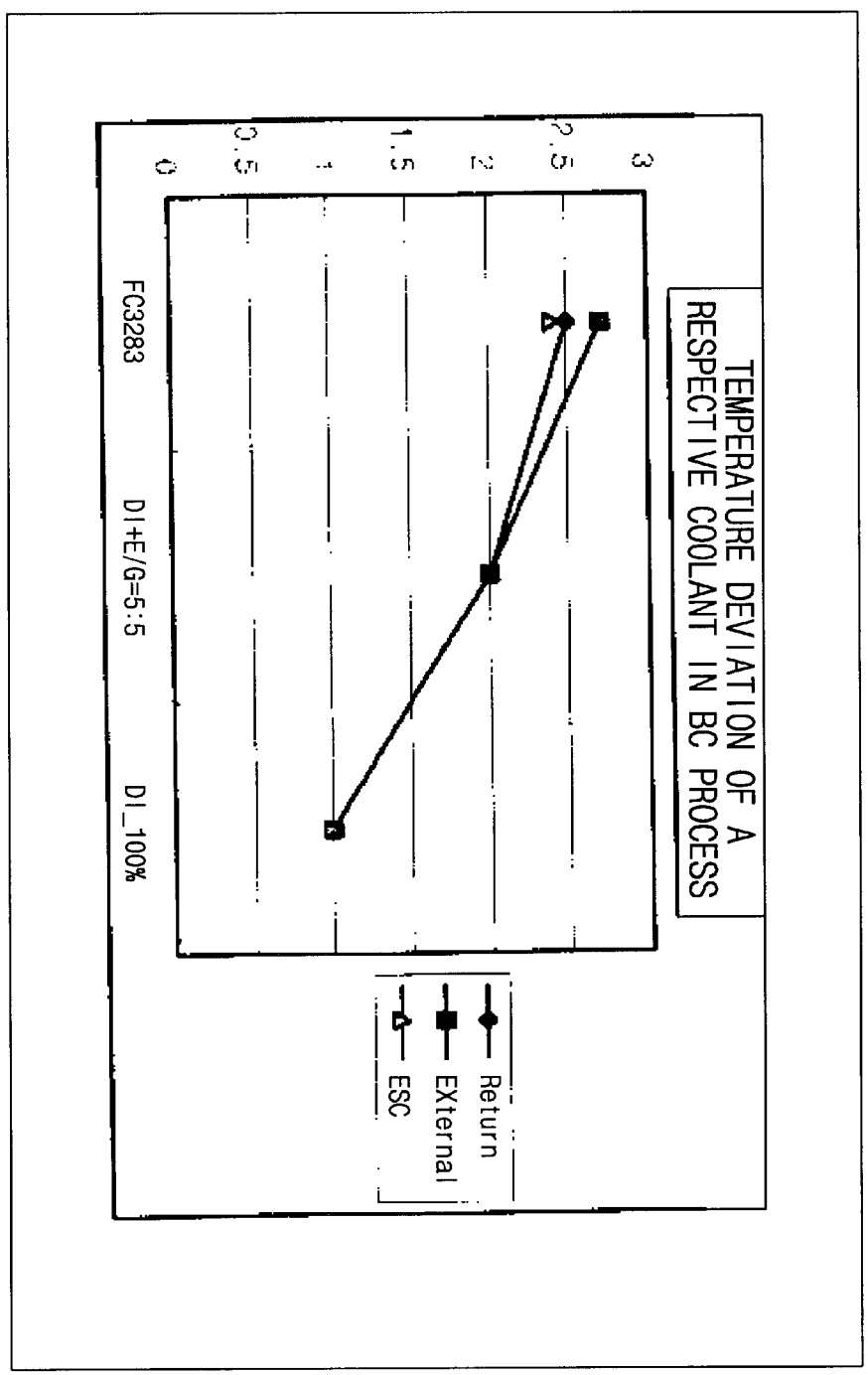
FIGS. 11A and 11B are graphs showing the dependence of a temperature characteristic of a single wafer on the type of coolant and position of a temperature sensor with respect to a bit-line contact hole forming process.
Figure 11B:
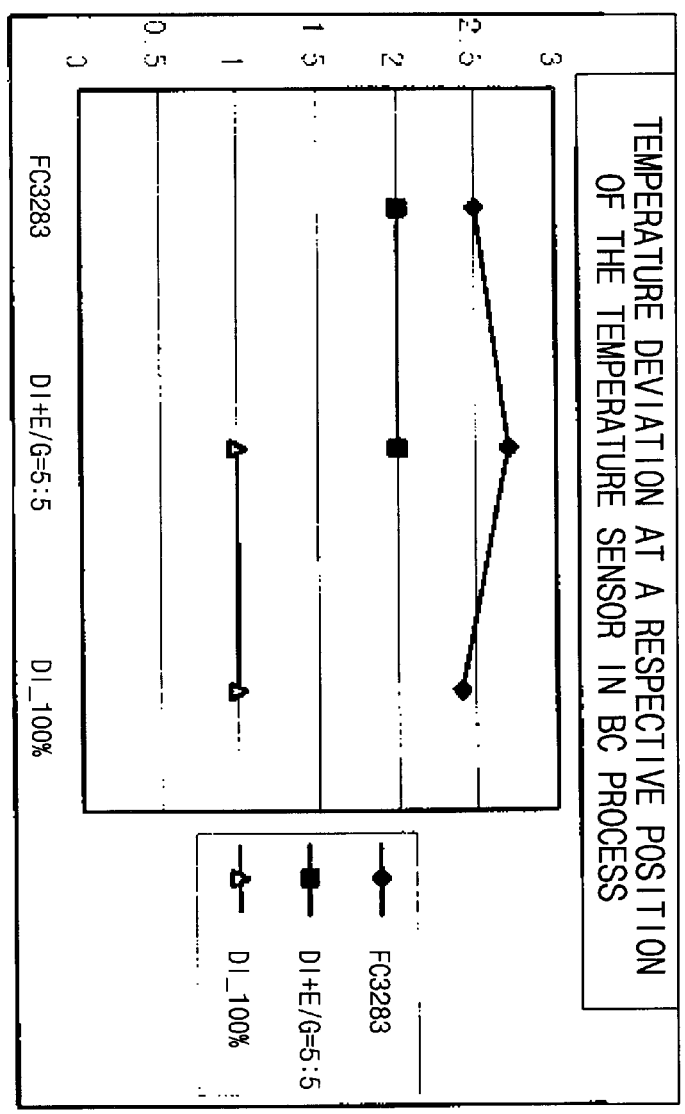
Figure 12A:
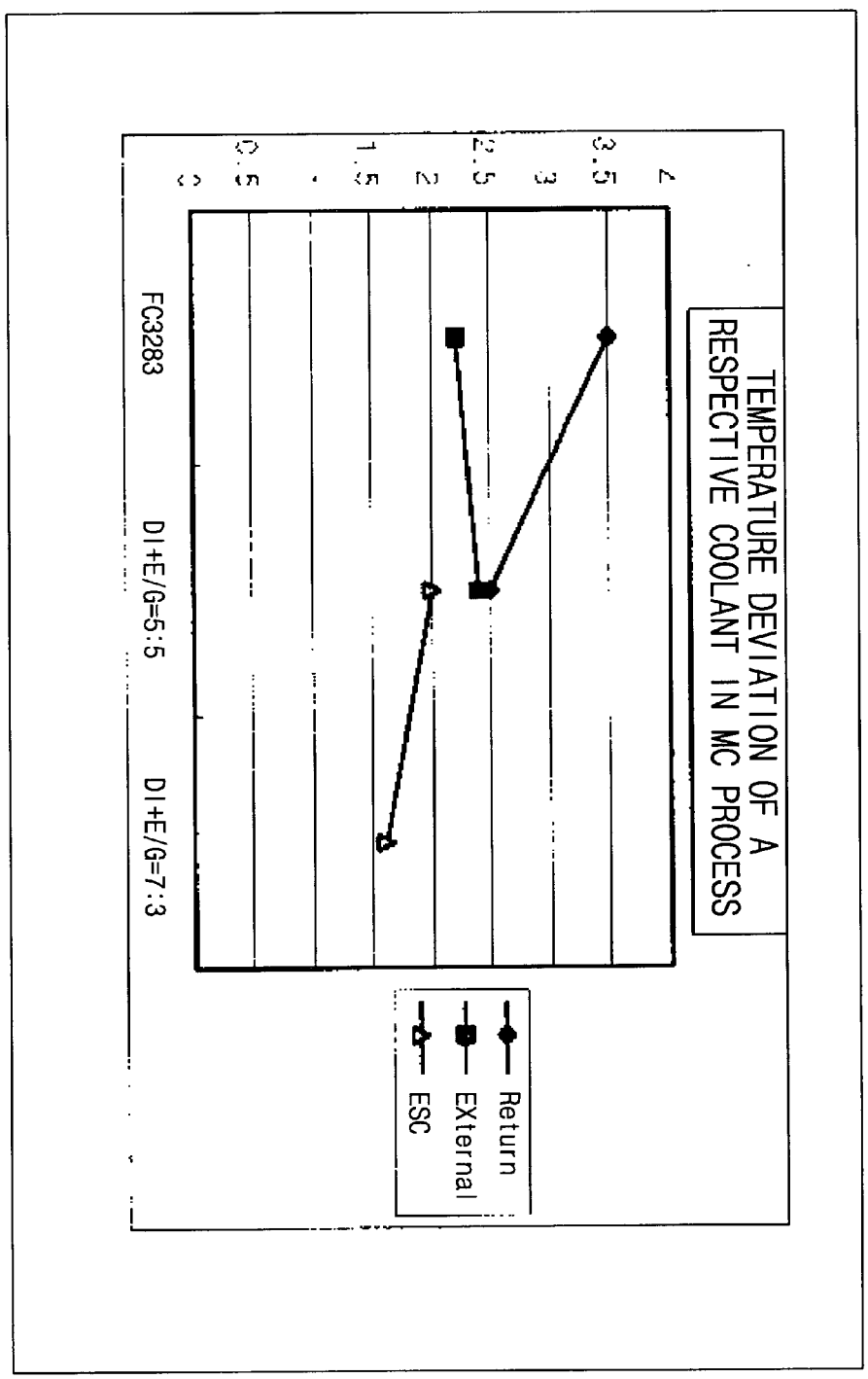
FIGS. 12A and 12B are graphs showing the dependence of a temperature characteristic of a single wafer on the type of coolant and position of a temperature sensor with respect to a metal contact hole forming process.
Figure 12B:
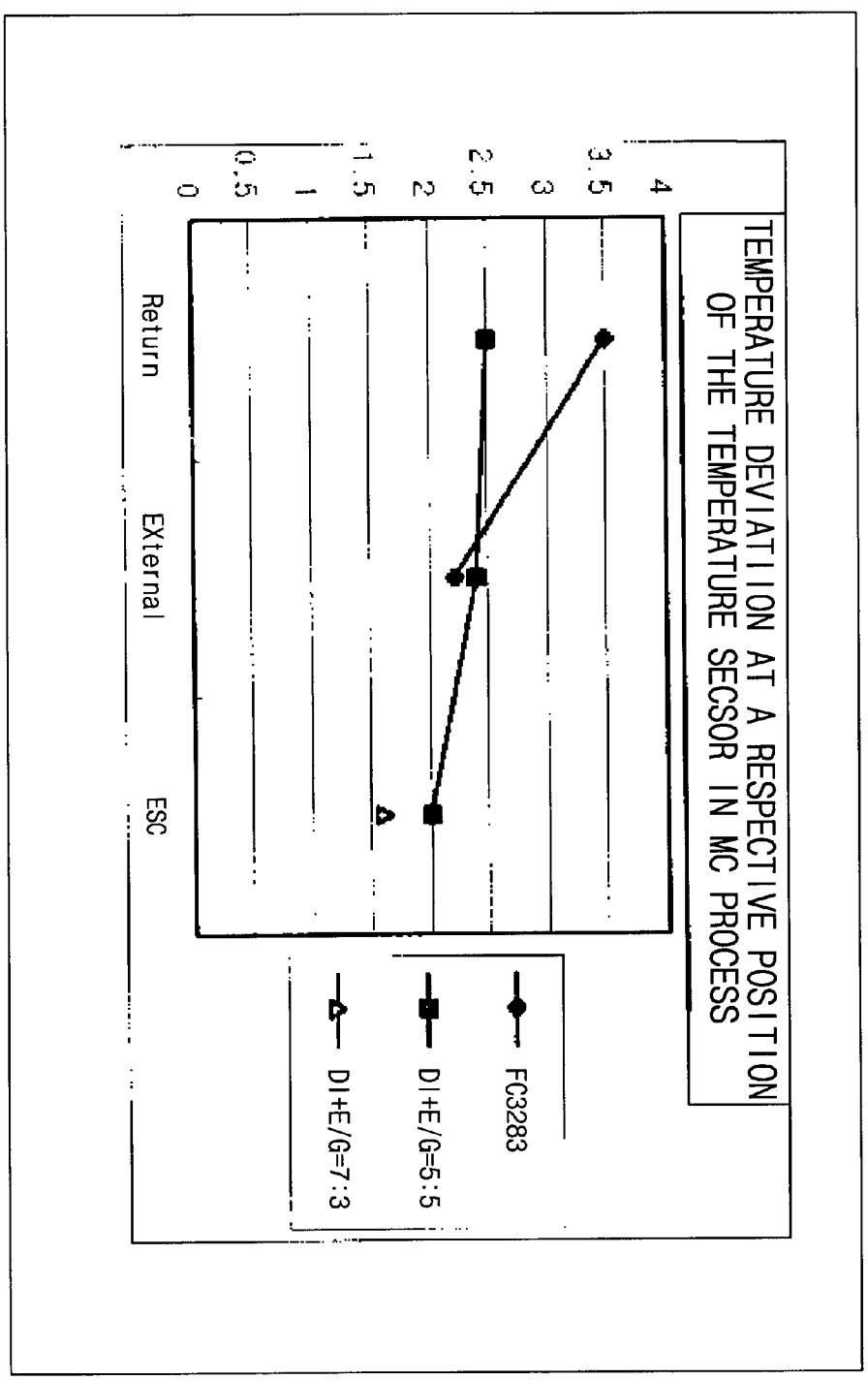

FIGS. 11A and 11B show the dependence of the temperature characteristic in a single wafer on the type of coolant and position of the temperature sensor in a bit-line contact hole forming process. FIGS. 12A and 12B are graphs showing the dependence of the temperature characteristic in a single wafer dependent on the type of coolant and position of the temperature sensor in a metal contact hole forming process.

As shown in FIGS. 11A to 12B, the process temperature variation is smaller when the ESC temperature sensor and deionized water are used than when the conventional withdrawal temperature sensor or outer temperature sensor and the FC-3283 coolant are used. That is, the present invention offers an improvement in maintaining the temperature of the electrostatic chuck.

Figure 13:
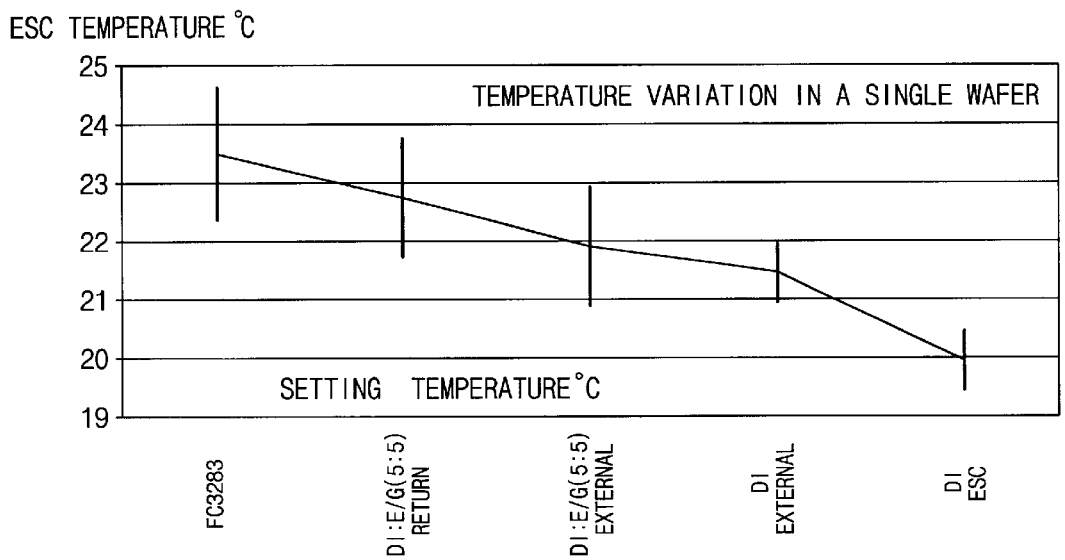
FIG. 13 is a graph illustrating the dependence of a temperature draft characteristic of the electrostatic chuck on the combination of the type of coolant and position of a temperature sensor.

FIG. 13 shows a temperature draft characteristic of the electrostatic chuck according to the combination of coolant used and the position of the temperature sensor. As the results illustrated in FIG. 13 show, the combination of pure deionized water and the ESC temperature sensor are best as the ESC temperature is close to the refrigerator temperature setting of 20° C. and the process temperature variation is less than 1° C. In other words, it is clear that the use of the ESC temperature sensor as the means for dictating the control of the refrigerator helps minimize the difference between the ESC temperature and the refrigerator temperature setting, whereas the high cooling capacity (efficiency) of the deionized water is responsible for minimizing the process temperature variation. Furthermore, because the process temperature variation is improved (minimal), the temperature difference between the wafers can be decreased by transferring all of the heat generated when the RF power is on to the coolant while the RF power is off.

Figure 14:
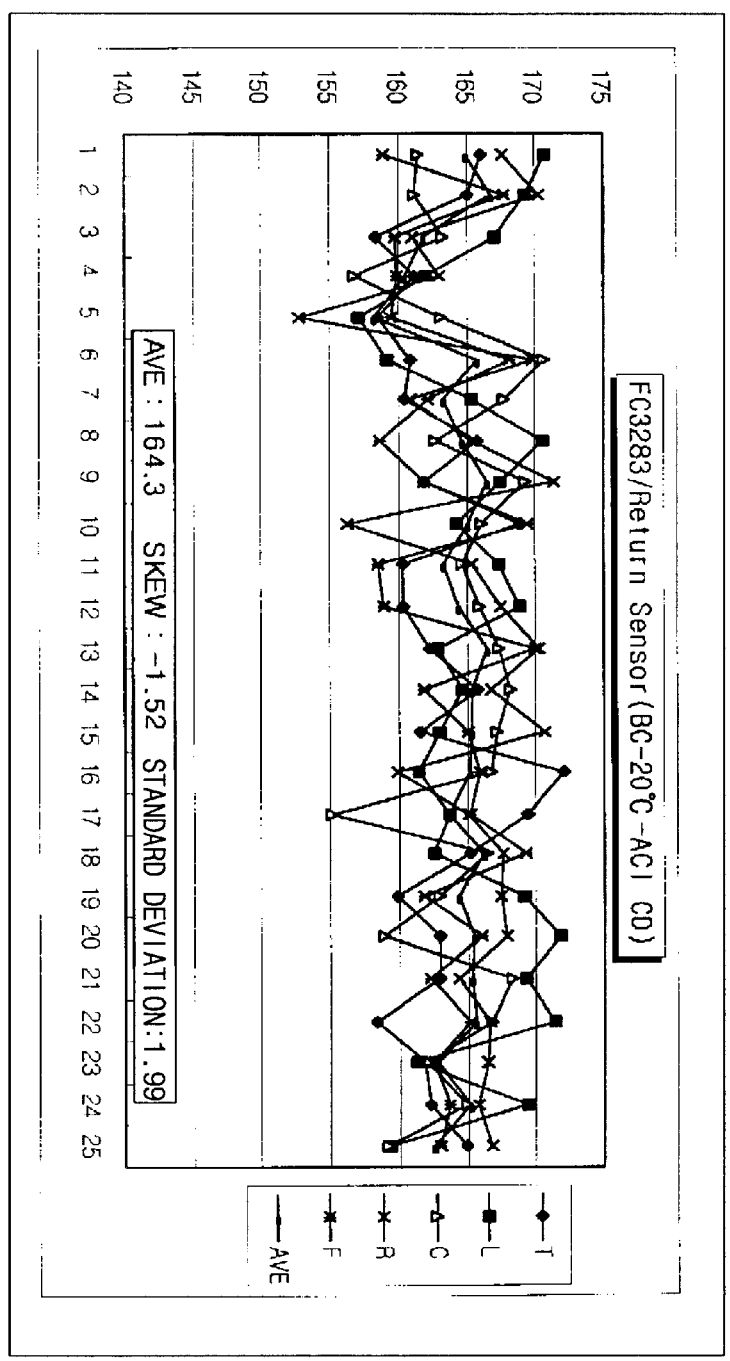
FIG. 14 is a graph illustrating a critical dimension (CD) dispersion characteristic of a wafer which has been processed (bit-line contact hole forming process) using a plasma apparatus having a conventional electrostatic chuck refrigeration system employing FC-3283 coolant and a withdrawal pipe temperature sensor.
Figure 15:
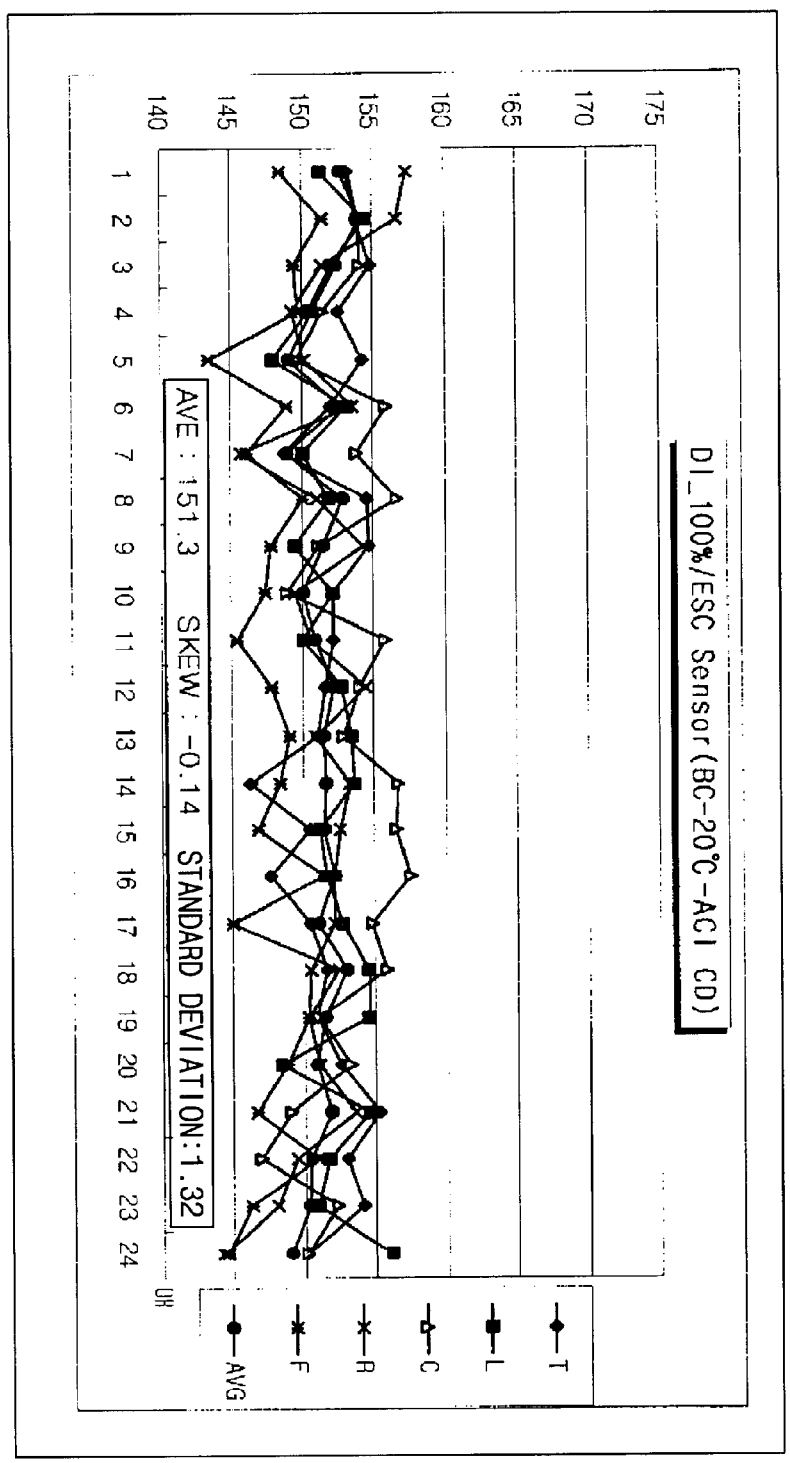
FIG. 15 is a graph illustrating the critical dimension (CD) dispersion characteristic of a wafer which has been processed (bit-line contact hole forming process) using a plasma apparatus having an electrostatic chuck refrigeration system employing pure deionized water coolant and an ESC temperature sensor according to the present invention.

FIG. 14 shows a critical dimension (CD) dispersion characteristic of a wafer which has been processed (bit-line contact hole forming process) using a plasma apparatus having a conventional electrostatic chuck refrigeration system employing FC-3283 coolant and a withdrawal pipe temperature sensor. On the other hand, FIG. 15 shows the critical dimension (CD) dispersion characteristic of a wafer which has been processed (bit-line contact hole forming process) using a plasma apparatus having an electrostatic chuck refrigeration system employing pure deionized water coolant and an ESC temperature sensor according to the present invention.

The data shown in each of FIGS. 14 and 15 was obtained at five portions of a respective wafer, namely at the wafer center (C), a portion (T) above the wafer center, a portion (F) below the wafer center, a portion (L) to the left of the wafer center and a portion (R) to the right of the wafer center.

As shown in FIG. 14, the average size of the bit-line contact hole is 164.3 nm when the conventional electrostatic chuck refrigeration system is used. The skew of the data is −1.2 and the standard deviation is 1.99. As shown in FIG. 15, the average size of the bit-line contact hole is 151.3 nm when the electrostatic chuck refrigeration system according to the present invention is used. In this case, the skew of the data is −0.14 and the standard deviation is 1.32.

As can be gleaned from the data above, the CD dispersion characteristic of a wafer and the temperature difference between the wafers are reduced when the present invention is applied to RF plasma etching, because of the comparatively high degree temperature uniformity of the electrostatic chuck provided by the present invention. Therefore, a higher yield of semiconductor devices can be expected, and the present invention offers help in securing wider margins necessary for the next generation of semiconductor devices. Furthermore, the present invention allows for relatively inexpensive and efficient coolant to be used in regulating the temperature of the ESC, whereby cost savings in fabricating the semiconductor devices are realized.

Although the present invention has been described with respect to the preferred embodiments thereof, the present invention is not so limited. Rather, various changes and modifications, as will be obvious to those skilled in the art, are seen to be within the true spirit and scope of the present invention as hereinafter claimed.

What is claimed is:

1. A semiconductor fabricating apparatus comprising:
   a process chamber, and an electrostatic chuck disposed in said process chamber;
   a coolant used to cool a body of said electrostatic chuck;
   a coolant loop through which said coolant circulates, said coolant loop including a heat exchanger having an inlet and an outlet, a refrigerator having an inlet and an outlet, a coolant supplying pipe connecting the inlet of said heat exchanger to the outlet of said refrigerator, a coolant withdrawal pipe connecting the outlet of said heat exchanger to the inlet of said refrigerator, and a deionizing filter that deionizes the coolant, said heat exchanger forming a coolant passageway, as part of said coolant loop, disposed in a heat exchange relationship with the body of said electrostatic chuck such that the coolant undergoes a heat exchange with the body of the electrostatic chuck as the coolant flows through said coolant passageway, said refrigerator being disposed outside of said process chamber so as to supply the coolant to the coolant passageway of the heat exchanger, withdraw the coolant from the heat exchanger after the heat exchange process occurs between the coolant and the electrostatic chuck, cool the coolant withdrawn from the heat exchanger, and supply the cooled coolant to the heat exchanger, and said deionizing filter being disposed in-line with said coolant withdrawal pipe adjacent the inlet of said refrigerator so as to deionize the coolant withdrawn from the heat exchanger;

a temperature sensor disposed within said electrostatic chuck and operable to detect the temperature of the body of the electrostatic chuck and issue a signal representative of the detected temperature; and a temperature controller operatively connected to said temperature sensor and to said refrigerator so as to control the refrigerator to regulate the temperature of the coolant in response to the signal issued by the temperature sensor.

2. An apparatus as claimed in claim 1, wherein said coolant comprises deionized water.

3. An apparatus as claimed in claim 1, wherein said coolant comprises a mixture of deionized water and anti-freeze.

4. An apparatus as claimed in claim 3, wherein the anti-freeze is ethylene glycol.

5. An apparatus as claimed in claim 4, wherein the ratio of the deionized water to the anti-freeze in the mixture is about 5:5.

* * * * *